(12) United States Patent
Shih et al.

(10) Patent No.: US 9,230,823 B1
(45) Date of Patent: Jan. 5, 2016

(54) METHOD OF PHOTORESIST STRIP

(71) Applicant: CHIPBOND TECHNOLOGY CORPORATION, Hsinchu (TW)

(72) Inventors: Cheng-Hung Shih, Changhua County (TW); Kuo-Hua Yang, Hsinchu (TW); Hsiang-Pin Hou, New Taipei (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 14/530,896

(22) Filed: Nov. 3, 2014

(30) Foreign Application Priority Data

Aug. 5, 2014  (TW) .............................. 103126825 A

(51) Int. Cl.
*H01L 21/44* (2006.01)
*H01L 21/311* (2006.01)

(52) U.S. Cl.
CPC .................................. *H01L 21/311* (2013.01)

(58) Field of Classification Search
CPC ......... H01L 24/05; H01L 24/11; H01L 24/13; H01L 24/81; H01L 21/4853; H01L 23/49816; H01L 2224/03914; H01L 2224/0401; H01L 2224/11526; H01L 2224/11914; H01L 2224/13006; H01L 2224/13007
USPC ................... 438/612–617; 257/737
See application file for complete search history.

(56) References Cited

U.S. PATENT DOCUMENTS

2011/0062580 A1 * 3/2011 Liu et al. ....................... 257/737
2011/0298123 A1 * 12/2011 Hwang et al. ................. 257/737

FOREIGN PATENT DOCUMENTS

| JP | 2-106040 A | 4/1990 |
| JP | 2000-12605 A | 1/2000 |
| JP | 2000-58494 A | 2/2000 |
| JP | 2001-85456 A | 3/2001 |
| JP | 2005-191587 A | 7/2005 |
| JP | 2006-49713 A | 2/2006 |
| JP | 2010-141251 A | 6/2010 |
| JP | 2010-524234 A | 7/2010 |

(Continued)

OTHER PUBLICATIONS

Japanese Office Action mailed Jun. 18, 2015 for Japanese Patent Application No. 2014-183253, 4 pages.

(Continued)

*Primary Examiner* — Brook Kebede
(74) *Attorney, Agent, or Firm* — Jackson IPG PLLC; Demian K. Jackson

(57) ABSTRACT

A method of photoresist strip includes providing a semiconductor substrate and performing an immerse step and a strip step, wherein the semiconductor substrate comprises a base, a bonding pad, a protective layer, an under bump metallurgy layer, a patterned photoresist layer and a bump. The patterned photoresist layer covers the under bump metallurgy layer and a lateral surface of the bump, wherein a first connection interface is formed between the patterned photoresist layer and the lateral surface of the bump, and a second connection interface is formed between the patterned photoresist layer and the under bump metallurgy layer. In the immerse step, the patterned photoresist layer contacts with a chemical solution which degrades the bond strength of the first connection interface. Therefore, in the strip step, the semiconductor substrate is scoured by a flow with appropriate force of impact, which strips the patterned photoresist layer from the base.

13 Claims, 17 Drawing Sheets

(56) References Cited

FOREIGN PATENT DOCUMENTS

| JP | 2011-171691 A | 9/2011 |
| JP | 2012-174741 A | 9/2012 |
| JP | 2014-22389 A | 2/2014 |
| TW | 200700935 | 1/2007 |
| TW | M352128 | 3/2009 |
| TW | 200923597 | 6/2009 |

OTHER PUBLICATIONS

Taiwanese Office Action mailed Oct. 6, 2014 for Taiwanese Patent Application No. 103126825, 6 pages.

* cited by examiner

METHOD OF PHOTORESIST STRIP

FIELD OF THE INVENTION

The present invention is generally relating to a method of photoresist strip, particularly to the method of photoresist strip for stripping photoresist by a flow.

BACKGROUND OF THE INVENTION

Conventional bump process includes forming a photoresist layer on a substrate; performing exposure/develop process to pattern the photoresist layer; plating plural bumps on the patterned photoresist layer; eventually removing the patterned photoresist layer therefore completing the bump process. In the process of removing the photoresist layer, the substrate which covered by the photoresist layer is immersed into a photoresist stripping solution to make the photoresist layer generate imbibition and decomposition therefore stripping from the substrate. However, according to differed product demands, the types of photoresist materials and photoresist stripping solutions used in process are totally different. For the issue mentioned above, in the process of conventional photoresist strip, the time for immersing the substrate into the photoresist stripping solution is likely too long therefore causing dispersion of the bumps or damage of a protection layer of the substrate. Oppositely, once the time for immersing the substrate into the photoresist stripping solution is too short, the remaining of the photoresist layer is likely occurred therefore affecting the yield rate in the conventional bump process. In addition, the thicker bump in the bump process, the thicker photoresist layer is performing. The thicker photoresist layer need longer time for immersed into the photoresist stripping solution and more photoresist stripping solution for strip which increase the loading capacity of the environmental and producing cost.

SUMMARY

A method of photoresist strip in the present invention is to scour a semiconductor substrate covered with photoresist by a flow to strip a photoresist layer from the semiconductor substrate therefore substantially reducing the immersion time of the semiconductor substrate with the photoresist layer in the chemical solution and the consumption of the chemical solution. As the result of the time for the photoresist layer immersed into the chemical solution is shorter, the method of photoresist strip in the present invention does not affect the structure of the semiconductor substrate therefore increasing the yield rate of process.

A method of photoresist strip in the present invention includes providing a semiconductor substrate, wherein the semiconductor substrate comprises a base, a bonding pad, a protective layer, an under bump metallurgy layer, a patterned photoresist layer and a bump. The bonding pad is located at a surface of the base. The protective layer covers the base and the bonding pad and comprises an opening for revealing the bonding pad. The under bump metallurgy layer covers the protective layer, and the bump which comprises a lateral surface is disposed on the under bump metallurgy layer. The patterned photoresist layer covers the under bump metallurgy layer and the lateral surface of the bump, wherein a first connection interface is formed between the patterned photoresist layer and the lateral surface of the bump, a second connection interface is formed between the patterned photoresist layer and the under bump metallurgy layer. The first connection interface comprises a first bond strength, and the second connection interface comprises a second bond strength. Next, the semiconductor substrate is immersed into a chemical solution, the chemical solution contacts with the patterned photoresist layer and infiltrates into the first connection interface to change from the first bond strength of the first connection interface to a third bond strength, the second strength of the second connection interface change for a fourth bond strength, wherein the third bond strength is smaller than the first bond strength. Next, the semiconductor substrate is scoured by a flow with a force of impact larger than the third bond strength and the fourth bond strength to strip the patterned photoresist layer from the base so as to reveal the lateral surface of the bump and the under bump metallurgy layer.

In this invention, the patterned photoresist layer is stripped by way of flow scouring to substantially reduce the time for the semiconductor substrate immersed into the chemical solution therefore lowering the usage amount of the chemical solution and producing costs. Besides, the bump of the semiconductor substrate or other device is avoidable from damage to increase the yield rate of process because of the short immersed time.

DETAILED DESCRIPTION OF THE INVENTION

Figure 1:
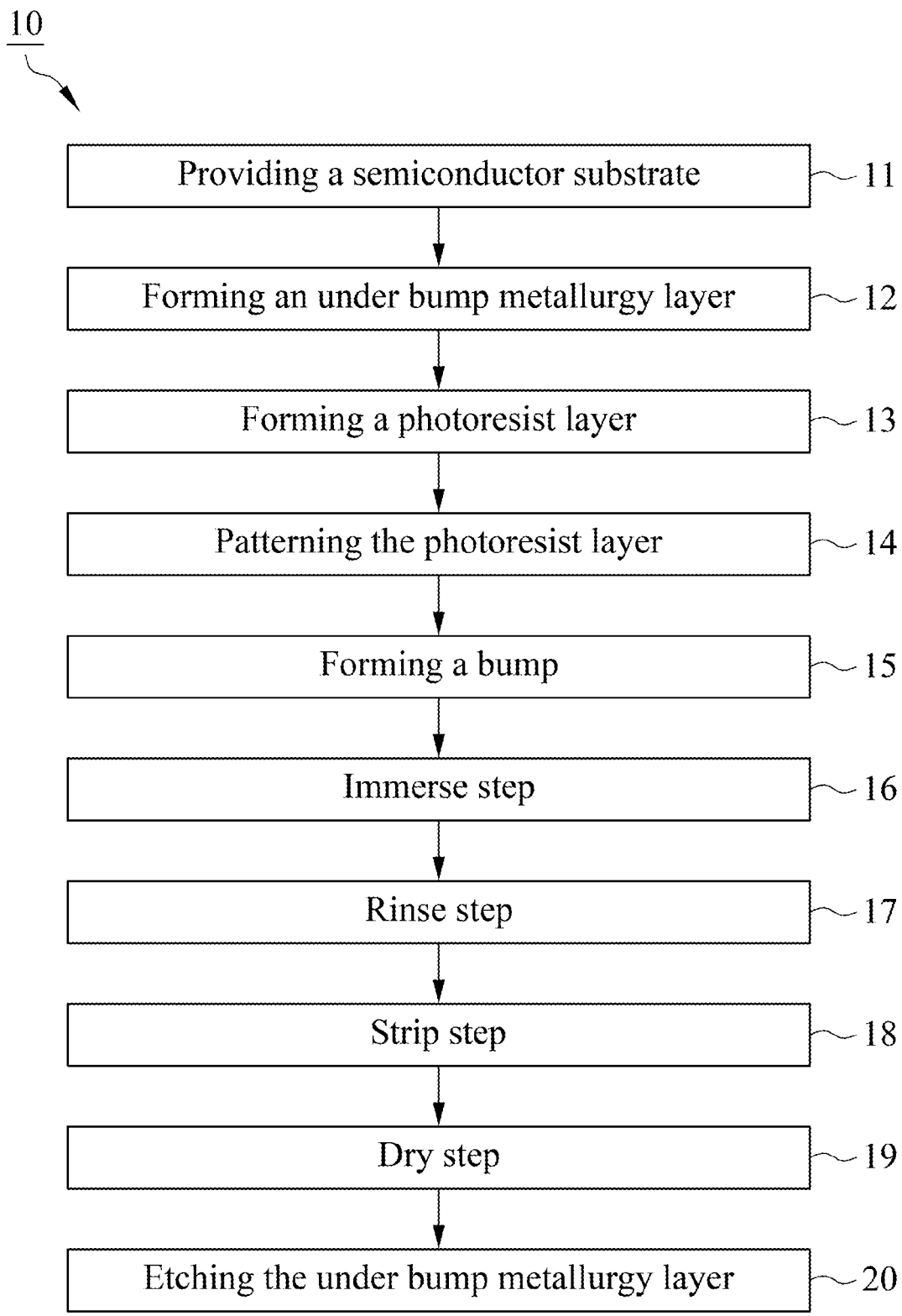
FIG. 1 is a flow chart illustrating a method of photoresist strip in accordance with a first embodiment of the present invention.
Figure 2:
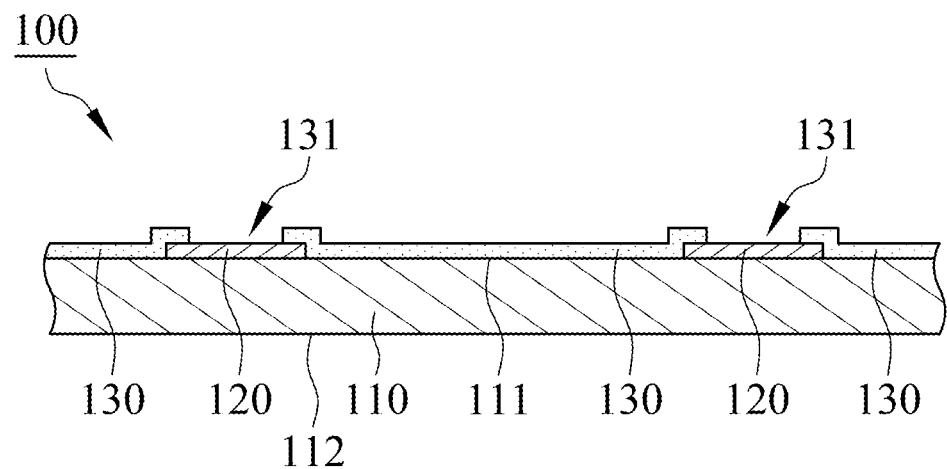
FIGS. 2 to 9 are laterally sectional diagrams illustrating a semiconductor substrate in accordance with the first embodiment of the present invention.

A method of photoresist strip 10 in accordance with a first embodiment of the present invention is illustrated in a flow chart of FIG. 1. With reference to FIGS. 1 and 2, the step 11 of providing a semiconductor substrate provides a semiconductor substrate 100, wherein the semiconductor substrate 100 comprises a base 110, a bonding pad 120 and a protective layer 130, the bonding pad 120 located at a surface 111 of the base 110 is selected from copper, aluminum, copper alloy or other conductive material, the protective layer 130 covers the base 110 and the bonding pad 120 and comprises an opening 131 to reveal the bonding pad 120.

Figure 3:
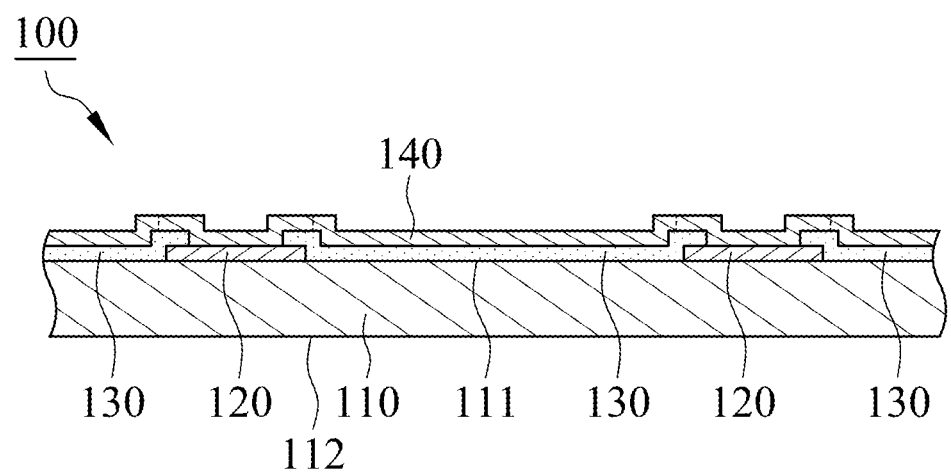

With reference to FIGS. 1 and 3, in the step 12 of forming an under bump metallurgy layer, an under bump metallurgy layer 140 is plated onto the protective layer 130 by evaporation, sputtering, electroplating or electroless plating. The under bump metallurgy layer 140 covers the protective layer 130 and connects to the bonding pad 120, wherein the under bump metallurgy layer 140 is a multi-layered metal structure including an adhesive layer, a diffusion barrier layer, a wetting layer and an oxidation barrier layer. However, the present invention is not limited therein.

Figure 4:
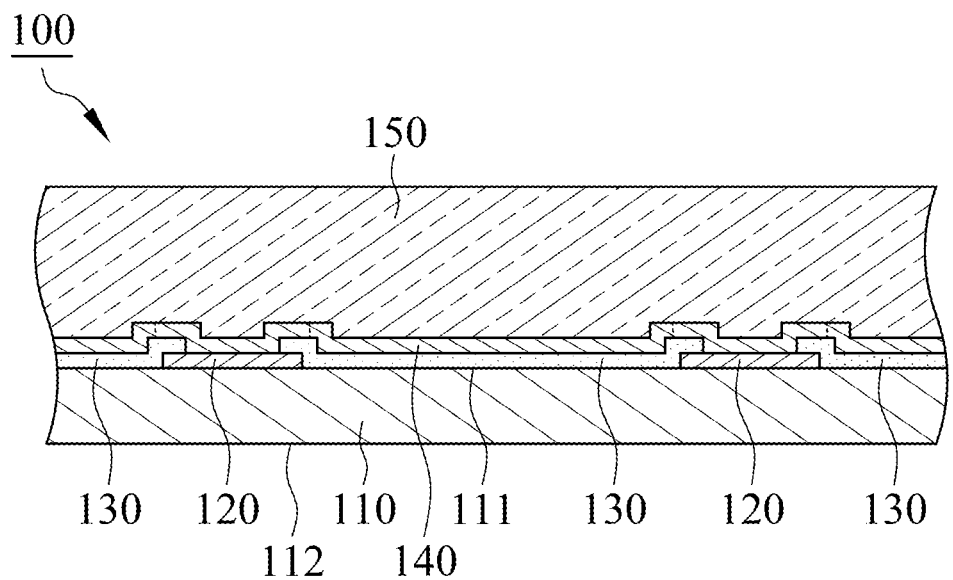

With reference to FIGS. 1 and 4, in the step 13 of forming a photoresist layer, a photoresist layer 150 is formed on the under bump metallurgy layer 140 by coating and baking. The photoresist layer 150 is selected from positive photoresist or negative photoresist.

Figure 5:
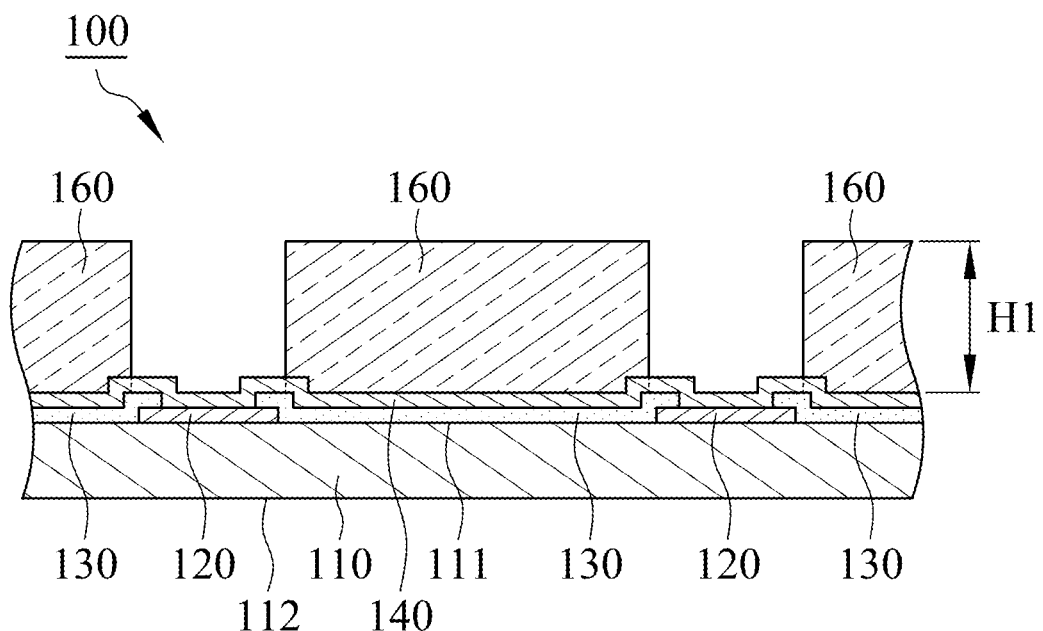

Referring to FIGS. 1, 4 and 5, in the step 14 of patterning the photoresist layer, an exposure process is performed to the photoresist layer 150 with a photo mask as mask for generating chemical diversion in a photo-sensitive area of the photoresist layer 150. Next, a developing process is performed to remove unnecessary photoresist by a developer therefore forming a patterned photoresist layer 160 with a height H1. The patterned photoresist layer 160 covers and reveals part of the under bump metallurgy layer 140. In this embodiment, the height H1 of the patterned photoresist layer 160 ranges from 150 μm to 200 μm.

Figure 6:
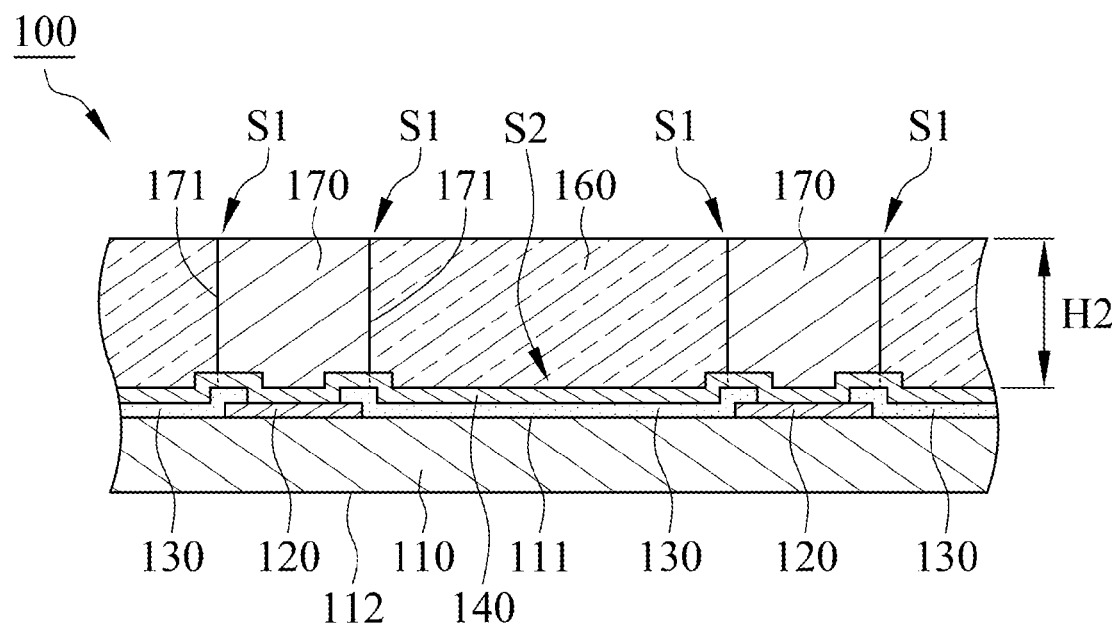

With reference to FIGS. 1 and 6, in the step 15 of forming a bump, a bump 170 is formed on the patterned photoresist layer 160 by evaporation, sputtering, electroplating, electro-less plating or printing. The bump 170 is disposed on the under bump metallurgy layer 140 and comprises a lateral surface 171 and a height H2. The bump 170 is used to electrically connect the bonding pad 120 to the other substrate (not shown in Fig.). The patterned photoresist layer 160 covers the lateral surface 171 of the bump 170, and the height H2 of the bump 170 ranges from 150 μm to 200 μm. The bump 170 is selected from gold, copper/nickel, copper/nickel/gold, tin/silver or other conductive metal.

Referring to FIG. 6, a first connection interface S1 is formed between the patterned photoresist layer 160 and the lateral surface 171 of the bump 170, a second connection interface S2 is formed between the patterned photoresist layer 160 and the under bump metallurgy layer 140, wherein the first connection interface S1 comprises a first bond strength and the second connection interface S2 comprises a second bond strength. The first bond strength and the second bond strength are strong, thus the patterned photoresist layer 160 cannot be easily stripped from the semiconductor substrate 100.

Figure 7:
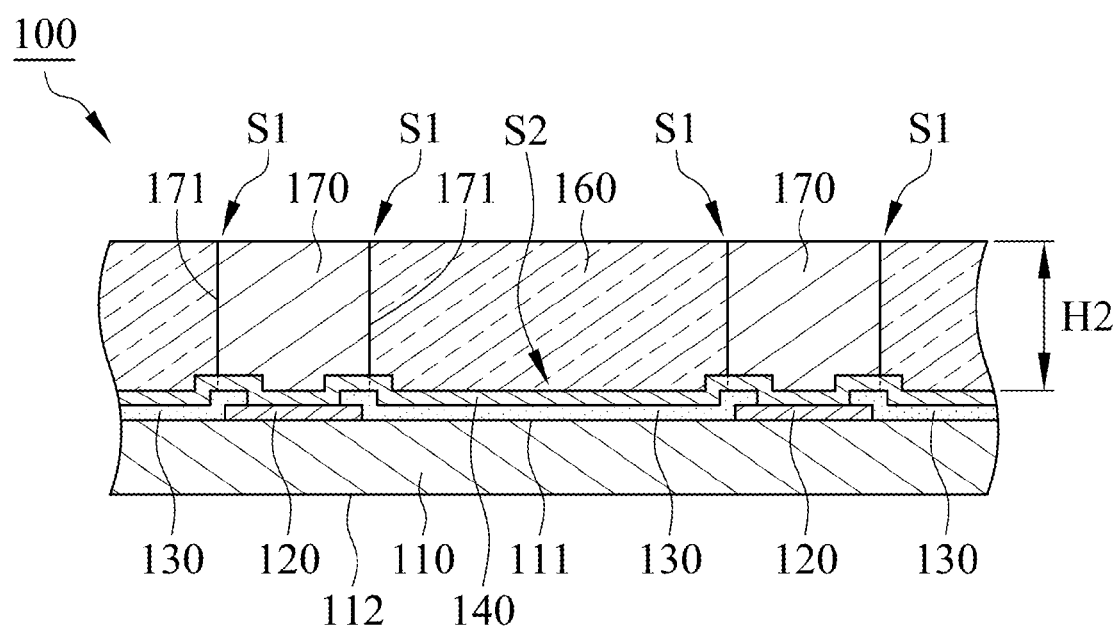

Referring to FIGS. 1 and 7, in an immerse step 16, the semiconductor substrate 100 is immersed into a chemical solution and contracts with the chemical solution to generate chemical diversion. Besides, the chemical solution infiltrates into the first connection interface S1 to change from the first bond strength of the first connection interface S1 to a third bond strength and change the second bond strength of the second connection interface S2 for a fourth bond strength. Preferably, the third bond strength is smaller than the first bond strength, and the fourth bond strength is smaller than the second bond strength. The function of the immerse step 16 is to lower the bond strength between the patterned photoresist layer 160, the under bump metallurgy layer 140 and the bump 170 instead of stripping the patterned photoresist layer 160 by the chemical solution. Therefore, the time for the semiconductor substrate 100 immersed into the chemical solution is substantially reduced in the immerse step 16, and the usage amount of the chemical solution is reduced. Preferably, the immerse step 16 is performed for 1 minute to 40 minutes.

Referring to FIGS. 1 and 7, a rinse step 17 is used for cleaning the semiconductor substrate 100 by de-ionized water (DIW) or ultra pure water (UPW). The rinse step 17 is mainly used to clean the chemical solution remained at a back surface 112 of the base 110. In the follow-up process, the back surface 112 of the base 110 of the semiconductor substrate 100 is fixed by robotic arm, once the chemical solution remained at the back surface 112 of the base 110 may cause the damage of the semiconductor substrate 100.

Figure 8:
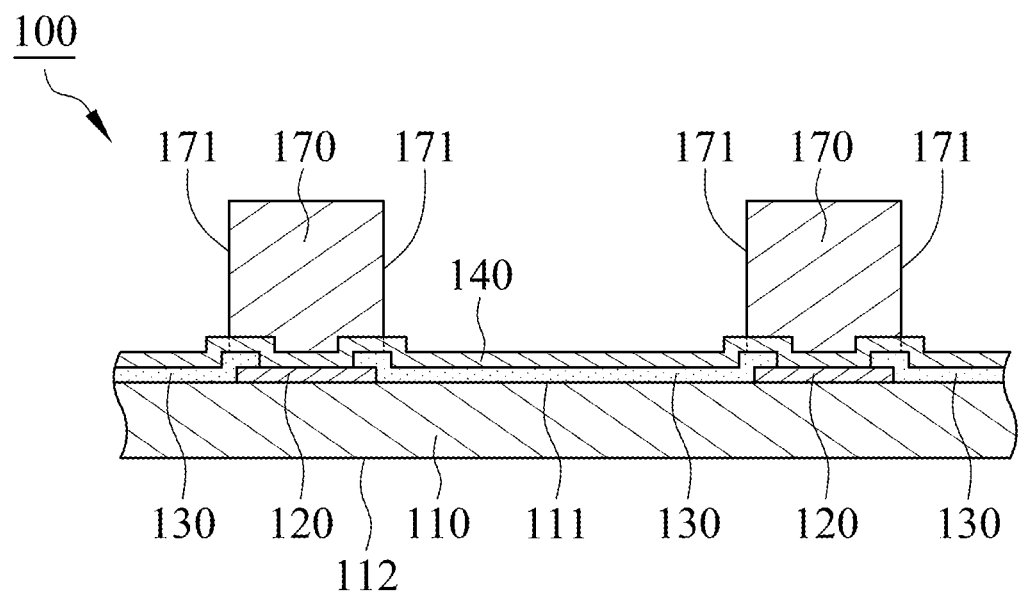

With reference to FIGS. 1 and 8, in the strip step 18, the semiconductor substrate 100 is scoured by a flow spurted from a nozzle (not drawn in Fig.). Preferably, the flow is two-phase flow and selected from de-ionized water mixed with nitrogen or carbon dioxide, wherein there is a 0.2 cm to 1 cm interval between the nozzle and the semiconductor substrate 100. The flow rate of the flow ranges from the 3 LPM to 5 LPM for making the flow possess a force of impact. The force of impact is larger than the third bond strength and the fourth bond strength to make the patterned photoresist layer 160 stripped from the base 110 for revealing the lateral surface 171 of the bump 170 and the under bump metallurgy layer 140. In the immerse step 16, a preliminary treatment to the patterned photoresist layer 160 is performed. Therefore, the patterned photoresist layer 160 is able to be stripped from the base 110 by the flow scouring on the semiconductor substrate 100 for 10 seconds to 30 seconds.

With reference to FIG. 1, in a dry step 19, the water remained on the semiconductor substrate 100 is removed by way of isopropyl alcohol drying (IPA drying) or rotary drying.

Figure 9:
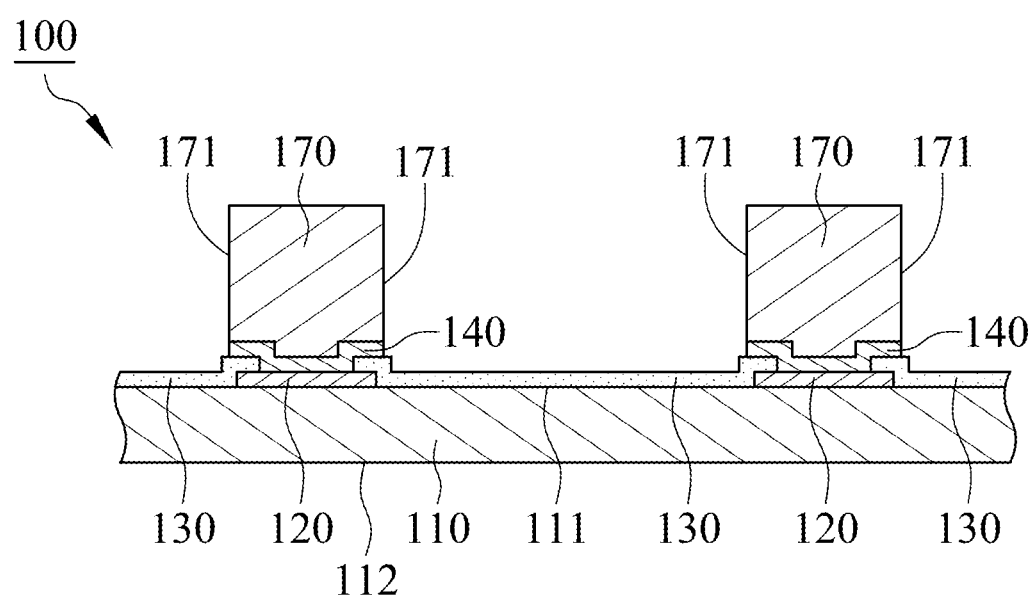
Figure 10:
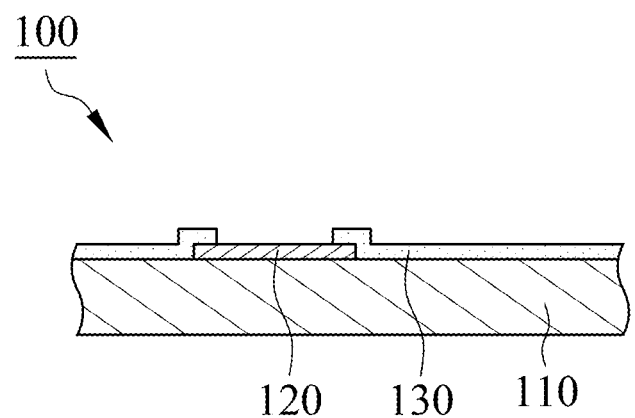
FIGS. 10 to 19 are laterally sectional diagrams illustrating a semiconductor substrate in accordance with a second embodiment of the present invention.
Figure 11:
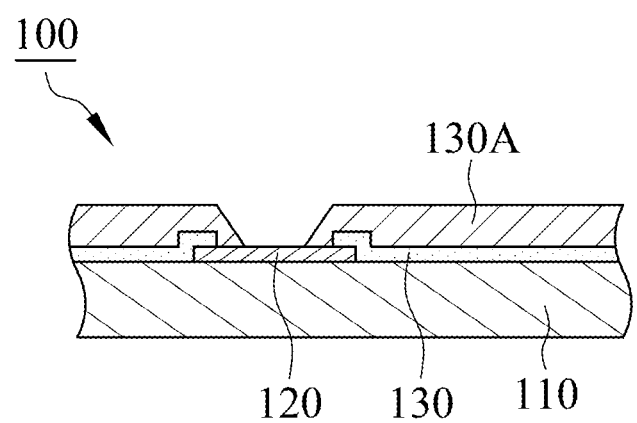
Figure 12:
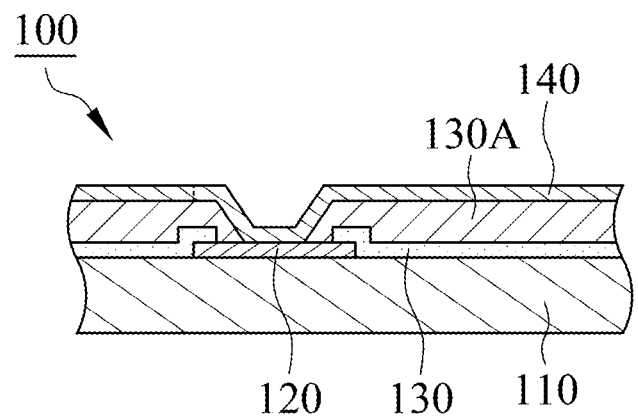

With reference to FIGS. 1 and 9, in the step 20 of etching the under bump metallurgy layer, the under bump metallurgy layer 140 is etched by the bump 170 as a mask to remove the part of the under bump metallurgy layer 140 not covered with the bump 170 and the under bump metallurgy layer 140 located right beneath the bump 170 is remained.

Figure 13:
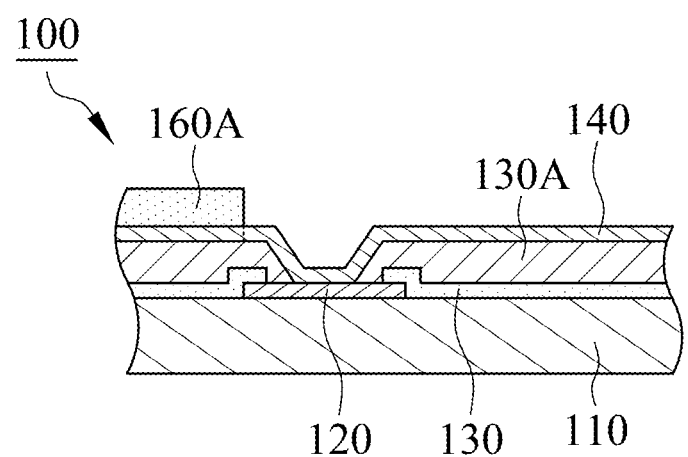
Figure 14:
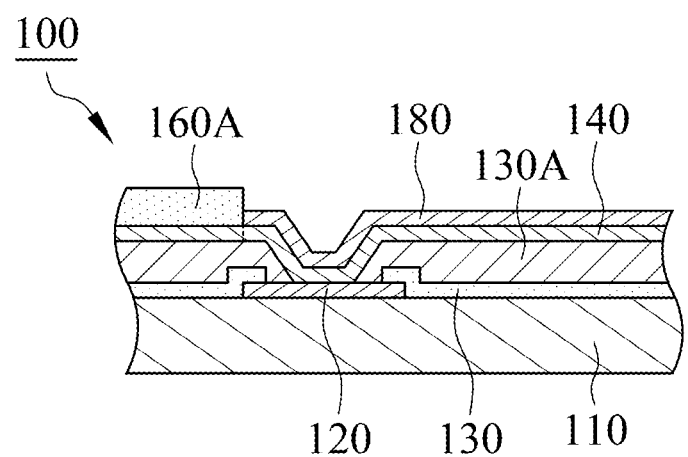
Figure 15:
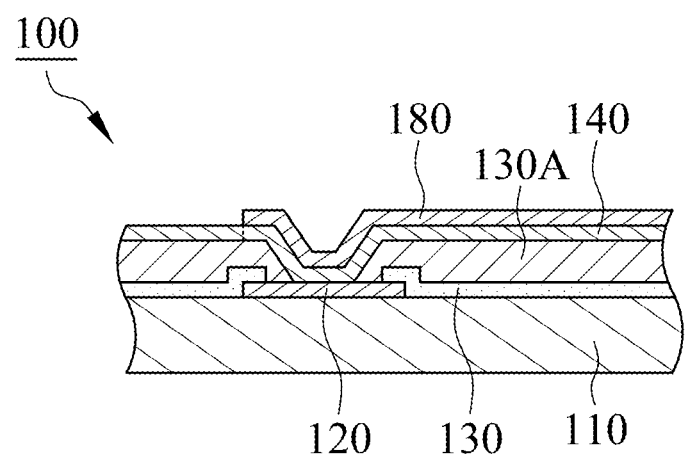
Figure 16:
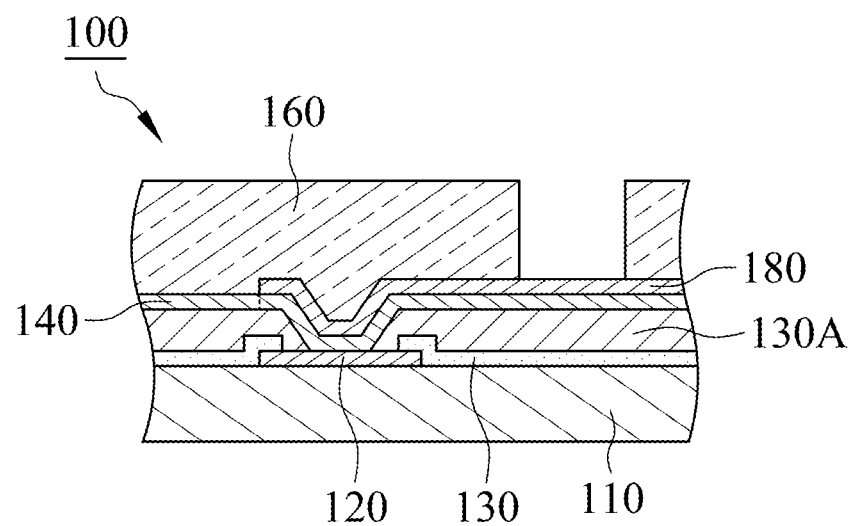
Figure 17:
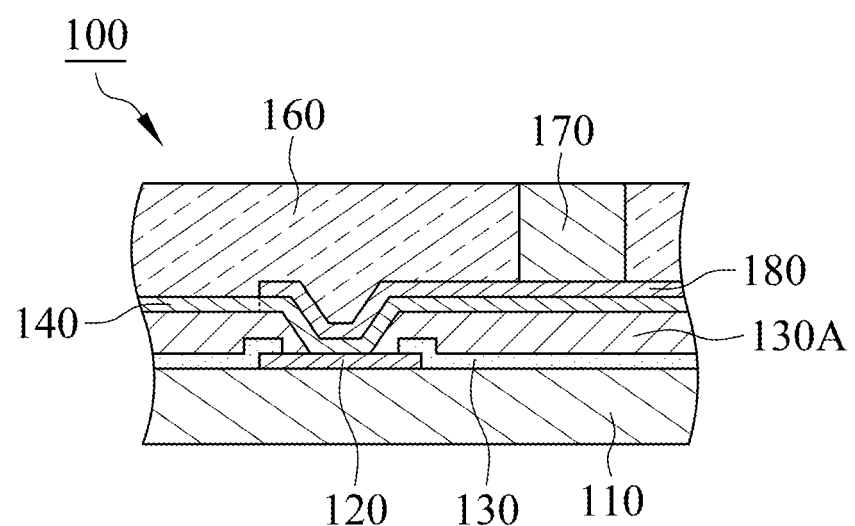
Figure 18:
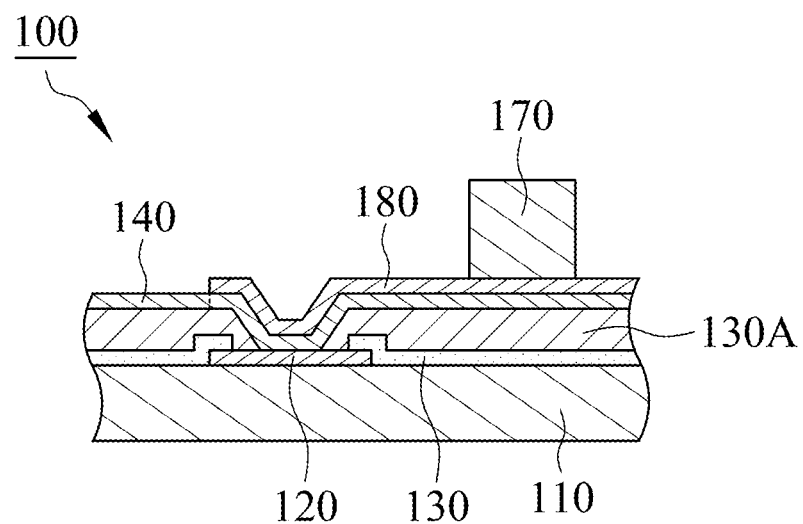
Figure 19:
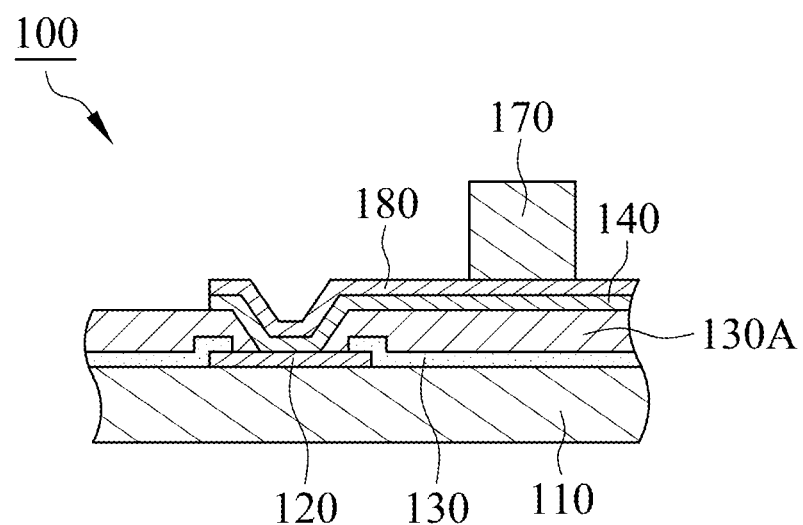
Figure 20:
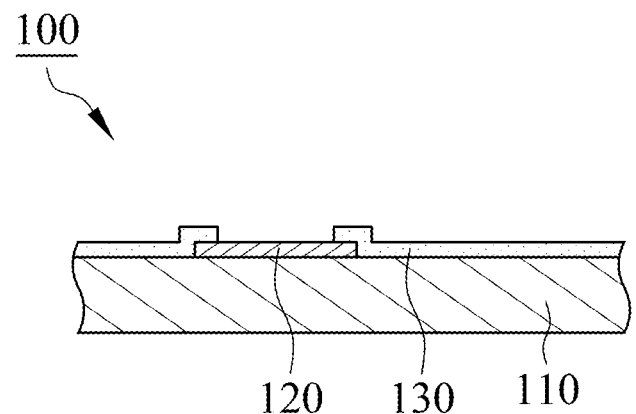
FIGS. 20 to 32 are laterally sectional diagrams illustrating a semiconductor substrate in accordance with a third embodiment of the present invention.
Figure 21:
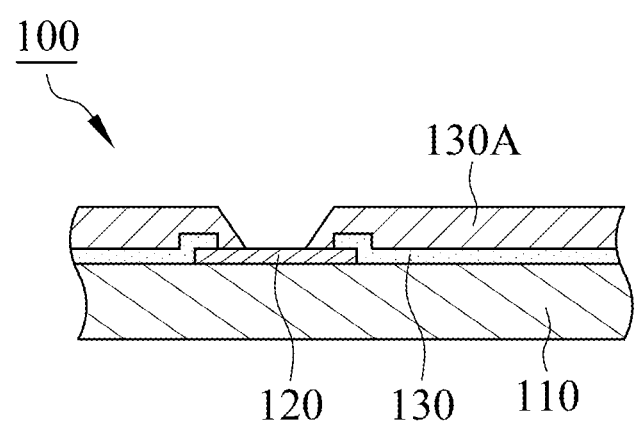
Figure 22:
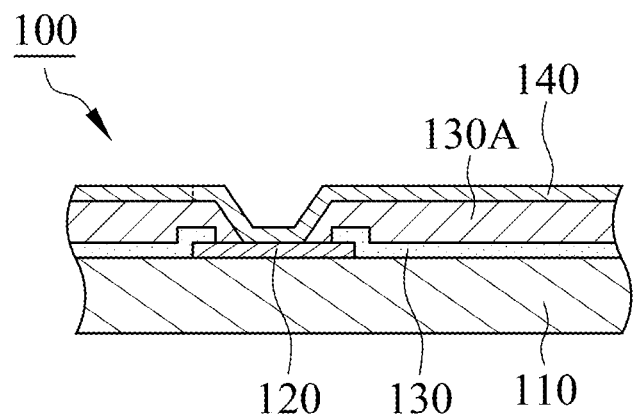
Figure 23:
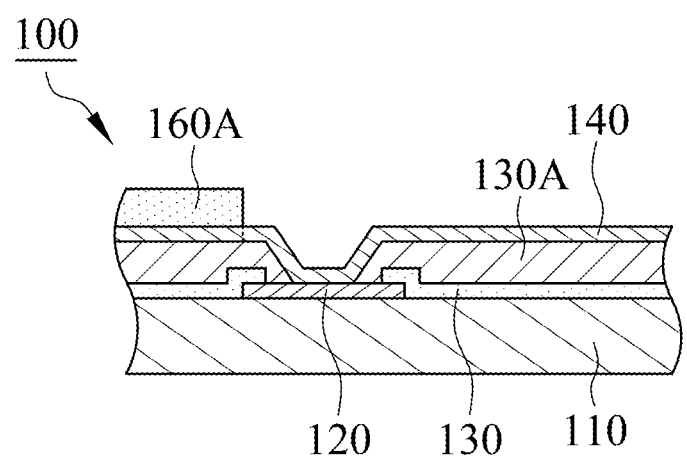

With reference to FIGS. 10 to 19, a manufacturing flow in accordance with a second embodiment of the present invention is illustrated by mentioned figures. The manufacturing flow is a 1P2M process, the difference between the second embodiment and the first embodiment is that the second embodiment further includes a protective layer 130A and a trace layer 180. The protective layer 130A ensures the insulation between the under bump metallurgy layer 140 and the base 110, and the protective layer 130A is formed on the protective layer 130 before the under bump metallurgy layer 140 formed, and the protective layer 130A also reveals the bonding pad 120. In this embodiment, the under bump metallurgy layer 140 is formed on the protective layer 130A and electrically connects with the bonding pad 120. Referring to FIGS. 13 to 15, the trace layer 180 is formed on the under bump metallurgy layer 140 by a patterned photoresist layer 160A to make the trace layer 180 be a redistribution layer, wherein the pattered photoresist layer 160A is stripped in the immerse step 16 and the strip step 18 after the trace layer 180 is formed on the under bump metallurgy layer 140. Identically, with reference to FIGS. 16 to 18, the bump 170 is formed on the trace layer 180 and the under bump metallurgy layer 140 by the patterned photoresist layer 160, and the patterned photoresist layer 160 is stripped in the immerse step 16 and the strip step 18. In this embodiment, the patterned photoresist layers 160A and the patterned photoresist layers 160 are both stripped in the immerse step 16 and the strip step 18, therefore, the usage amount of the chemical solution is substantially reduced, and the damage of micro circuit on the base 110 is avoidable.

Figure 24:
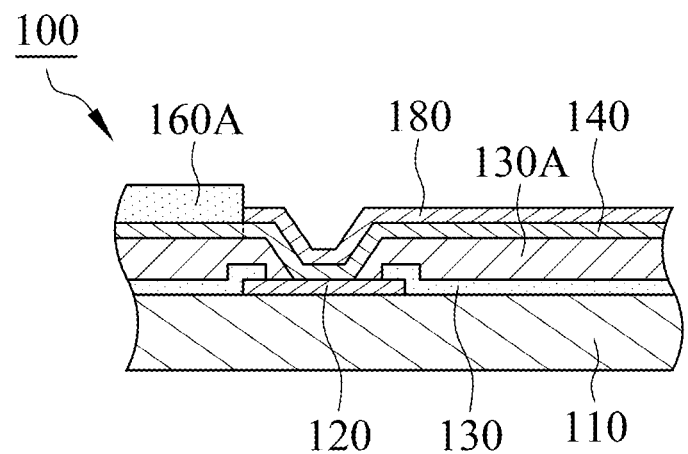
Figure 25:
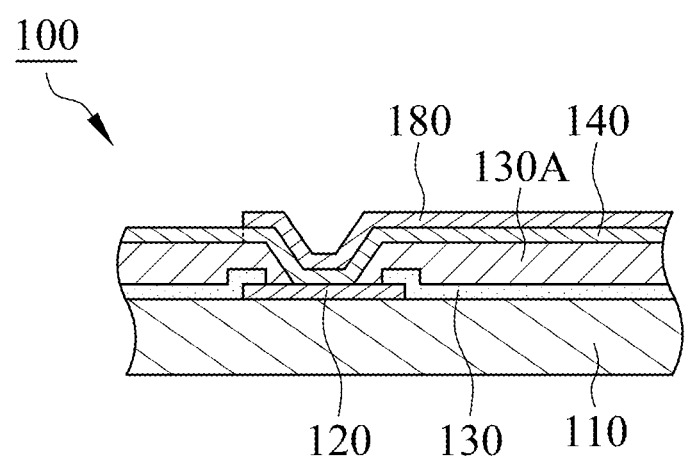
Figure 26:
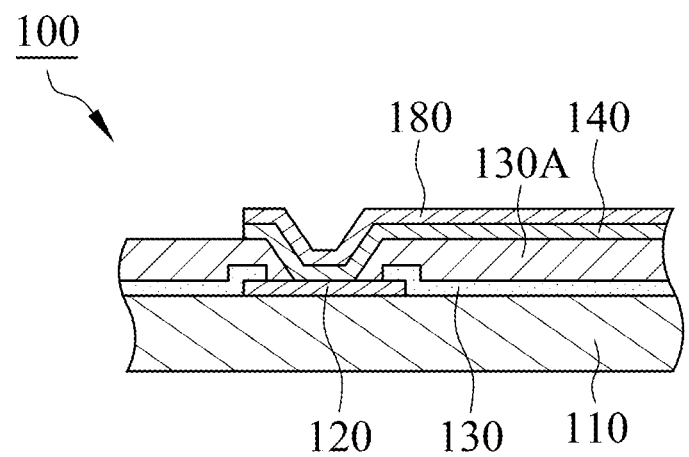
Figure 27:
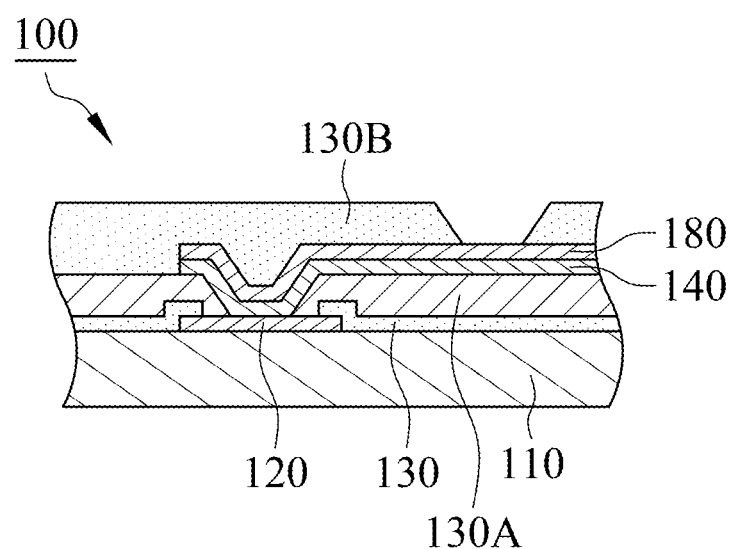
Figure 28:
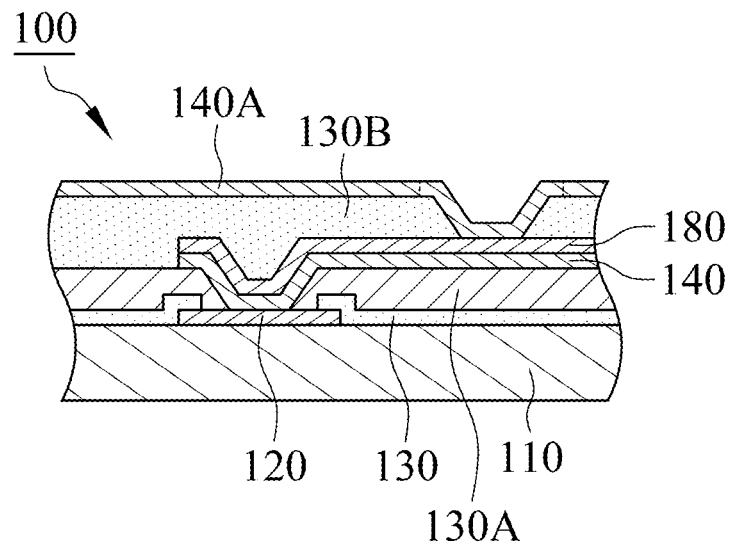
Figure 29:
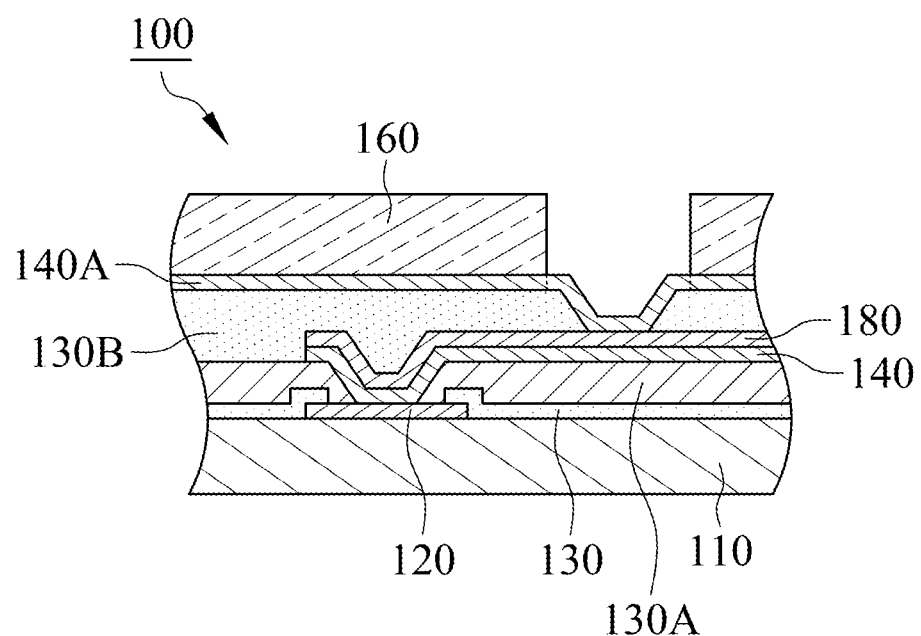
Figure 30:
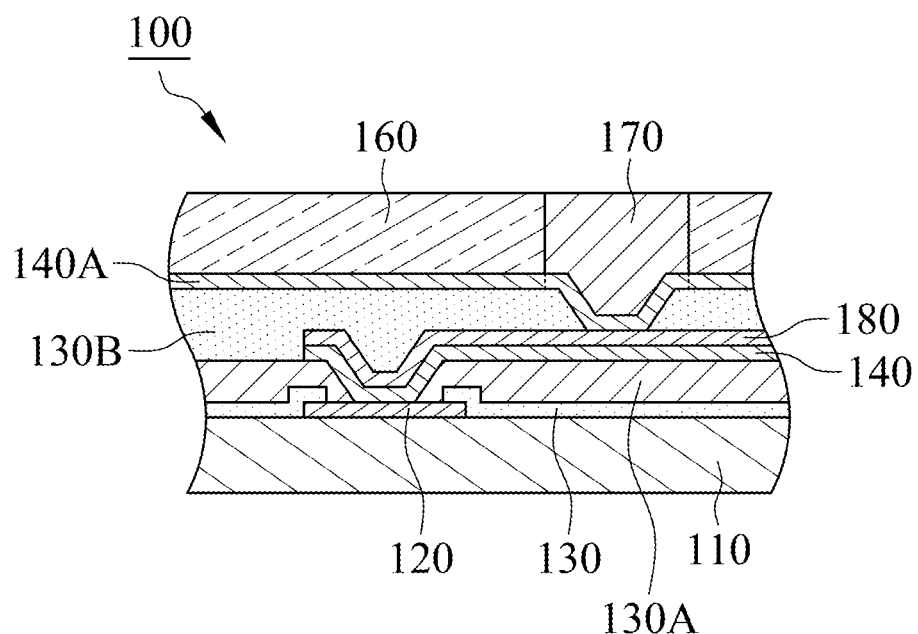
Figure 31:
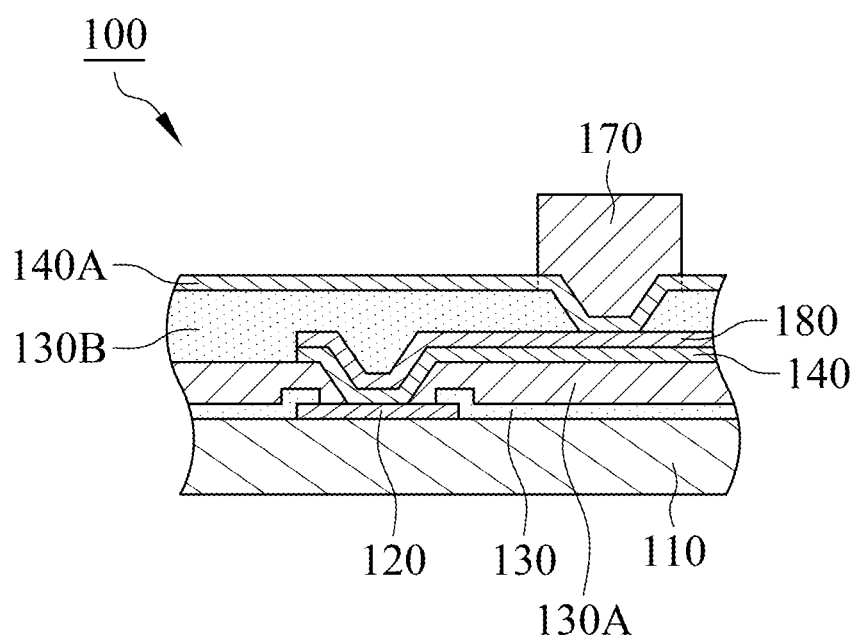
Figure 32:
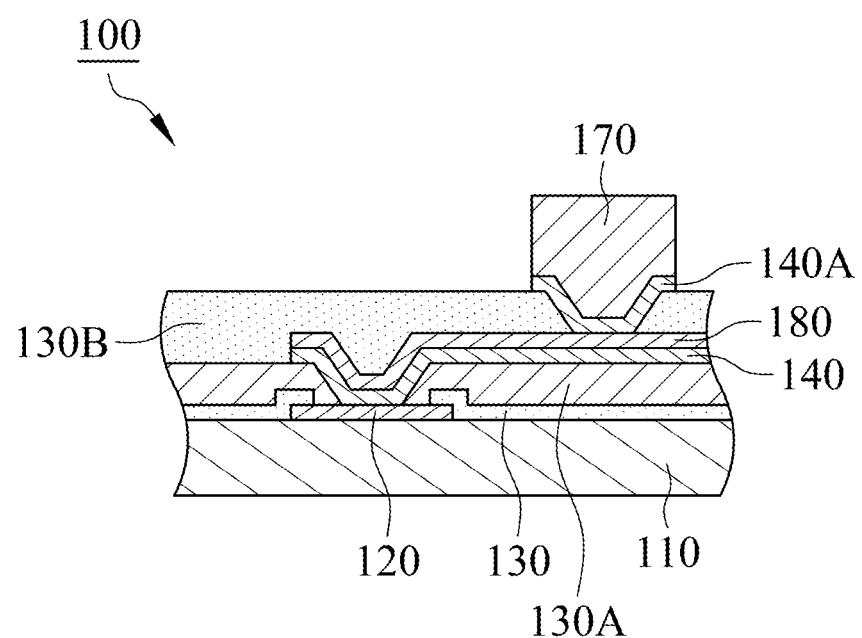

With reference to FIGS. 20 to 32, a manufacturing flow in accordance with a third embodiment of the present invention is illustrated by mentioned figures. The manufacturing flow is a 2P2M process, the difference between the third embodiment and the first embodiment is that the third embodiment further includes a protective layer 130A, a trace layer 180, a protective layer 130B and an under bump metallurgy layer 140A, wherein the protective layer 130A and the trace layer 180 are the same as the protective layer 130A and the trace layer 180 in the second embodiment that be an insulation layer and a redistribution layer respectively. With reference to FIG. 27, in this embodiment, after the trace layer 180 formed, the protective layer 130B is formed on the trace layer 180 to protect and reveal the trace layer 180. Referring to FIGS. 28 to 31, in this embodiment, the under bump metallurgy layer 140A is formed on the protective layer 130A for being an adhesive layer between the bump 170 and the protective layer 130A. Next, the bump 170 is formed on the under bump metallurgy layer 140A by the patterned photoresist layer 160. Referring to FIGS. 24 and 30, in this embodiment, after the trace layer 180 and the bump 170 are formed by the patterned photoresist layers 160A and the patterned photoresist layers 160 respectively, the patterned photoresist layers 160A and the patterned photoresist layers 160 are both stripped in the immerse step 16 and the strip step 18 for reducing the usage amount of the chemical solution substantially therefore preventing micro circuit of the base 110 from damage.

Besides, all of the patterned photoresist layers in the process of 3P3M, 4P4M or multiple-P multiple-M are stripped in the immerse step 16 and the strip step 18. For the reason that the process of multiple-P multiple-M needs multiple strip processes to strip the patterned photoresist layers, the method 10 of photoresist strip of the present invention saves more usage amount of the chemical solution, meanwhile lower the producing costs and the environmental pollution.

In this invention, the patterned photoresist layer 160 is stripped by way of flow scouring to substantially reduce the time for the semiconductor substrate 100 immersed into the chemical solution therefore lowering the usage amount of the chemical solution and producing costs. Besides, the bump 170 of the semiconductor substrate 100 or other device is avoidable from damage to increase the yield rate of process because the short immersion time.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A method of photoresist strip includes:
   providing a semiconductor substrate having a base, a bonding pad, a protective layer, an under bump metallurgy layer, a patterned photoresist layer and a bump, wherein the bonding pad is located at a surface of the base, the protective layer covers the base and the bonding pad and comprises an opening for revealing the bonding pad, the under bump metallurgy layer covers the protective layer, the bump is disposed on the under bump metallurgy layer and comprises a lateral surface, the patterned photoresist layer covers the under bump metallurgy layer and the lateral surface of the bump, wherein a first connection interface is formed between the patterned photoresist layer and the lateral surface of the bump, a second connection interface is formed between the patterned photoresist layer and the under bump metallurgy layer, the first connection interface comprises a first bond strength and the second connection interface comprises a second bond strength;
   an immerse step, immersing the semiconductor substrate into a chemical solution, the chemical solution contacts with the patterned photoresist layer and infiltrates into the first connection interface to change the first bond strength of the first connection interface into a third bond strength, the second strength of the second connection interface change for a fourth bond strength, wherein the third bond strength is smaller than the first bond strength; and
   a strip step, scouring the semiconductor substrate by a flow, wherein the flow has a force of impact larger than the third bond strength and the fourth bond strength to strip the patterned photoresist layer from the base so as to reveal the lateral surface of the bump and the under bump metallurgy layer.

2. The method of photoresist strip in accordance with claim 1, wherein the fourth bond strength is smaller than the second bond strength.

3. The method of photoresist strip in accordance with claim 1, wherein the flow is a two-phase flow.

4. The method of photoresist strip in accordance with claim 3, wherein the flow rate of the flow ranges from 3 LPM to 5 LPM.

5. The method of photoresist strip in accordance with claim 4, wherein in the strip step, the flow is spurted from a nozzle, there is an interval between the nozzle and the semiconductor substrate, and the interval ranges from 0.2 cm to 1 cm.

6. The method of photoresist strip in accordance with claim 5, wherein scouring the semiconductor substrate by the flow in a scouring time for 10 seconds to 30 seconds.

7. The method of photoresist strip in accordance with claim 1, wherein immersing the semiconductor substrate into the chemical solution in an immersion time for 1 minute to 40 minutes.

8. The method of photoresist strip in accordance with claim 3, wherein the flow is selected from de-ionized water mixed with nitrogen or carbon dioxide.

9. The method of photoresist strip in accordance with claim 1, wherein the bump has a height of 150 μm to 200 μm.

10. The method of photoresist strip in accordance with claim 1, wherein the patterned photoresist layer has a height of 150 μm to 200 μm.

11. The method of photoresist strip in accordance with claim 9, wherein the patterned photoresist layer has a height of 150 μm to 200 μm.

12. The method of photoresist strip in accordance with claim 1 further includes a rinse step prior to the strip step for cleaning the chemical solution remained at a back surface of the base.

13. The method of photoresist strip in accordance with claim 1 further includes a dry step for removing water after the strip step.

* * * * *